US006858124B2

(12) United States Patent
Zazzera et al.

(10) Patent No.: US 6,858,124 B2
(45) Date of Patent: Feb. 22, 2005

(54) METHODS FOR POLISHING AND/OR CLEANING COPPER INTERCONNECTS AND/OR FILM AND COMPOSITIONS THEREFOR

(75) Inventors: Lawrence A. Zazzera, Edina, MN (US); Michael J. Parent, Oakdale, MN (US); William M. Lamanna, Stillwater, MN (US); Susrut Kesari, Santa Clara, CA (US)

(73) Assignee: 3M Innovative Properties Company, St. Paul, MN (US)

( * ) Notice: Subject to any disclaimer, the term of this patent is extended or adjusted under 35 U.S.C. 154(b) by 262 days.

(21) Appl. No.: 10/320,254

(22) Filed: Dec. 16, 2002

(65) Prior Publication Data

US 2004/0112759 A1 Jun. 17, 2004

(51) Int. Cl.$^7$ .............................. C25F 3/00; C23G 1/00
(52) U.S. Cl. ............................ 205/640; 134/2; 134/3; 205/662; 205/674; 205/675; 205/676; 205/684; 205/705; 205/717; 205/721; 205/722; 205/723; 252/79.1; 252/79.2; 252/79.3; 252/79.4
(58) Field of Search ................................ 205/640, 662, 205/674, 675, 676, 684, 705, 717, 721, 722, 723; 134/2, 3; 252/79.1, 79.2, 79.3, 79.4

(56) References Cited

U.S. PATENT DOCUMENTS

| 5,767,054 A | 6/1998 | Sprugel et al. |
| 6,178,585 B1 | 1/2001 | Cadien et al. |
| 6,194,317 B1 | 2/2001 | Kaisaki et al. |
| 6,245,663 B1 | 6/2001 | Zhao et al. |
| 6,284,656 B1 | 9/2001 | Farrar |
| 6,287,954 B1 | 9/2001 | Ashley et al. |
| 6,287,973 B2 | 9/2001 | Aoi |
| 6,287,977 B1 | 9/2001 | Hashim et al. |
| 6,290,578 B1 | 9/2001 | Bowman et al. |
| 6,290,833 B1 | 9/2001 | Chen |
| 6,291,082 B1 | 9/2001 | Lopatin |
| 6,291,333 B1 | 9/2001 | Lou |
| 6,291,887 B1 | 9/2001 | Wang et al. |
| 6,292,265 B1 | 9/2001 | Finarov et al. |
| 6,358,899 B1 | 3/2002 | Hackett |

FOREIGN PATENT DOCUMENTS

| EP | 0 419 845 | 4/1991 |
| EP | 1 134 218 | 9/2001 |
| EP | 1 333 477 | 8/2003 |
| JP | 11092754 | 4/1999 |
| WO | WO 99/30381 | 6/1999 |
| WO | WO 01/74985 A1 | 10/2001 |
| WO | WO 01/75955 A1 | 10/2001 |
| WO | WO 02/45142 | 6/2002 |
| WO | WO 02/092211 | 11/2002 |

OTHER PUBLICATIONS

Product Information: "3M Fluorad™ Fluorosurfactants, Sep." 1997, 4 pages.
Product Information: "3M Fluorad™ Fluorochemical Acid FC–24 Trifluoromethanesulfonic Acid," Jun., 1995, 12 pages.
Technical Information: "3M Fluorad™ Etching Bath Additive FC–93," Mar., 1995, 4 pages.
Product Information: "3M Fluorad™ Fluorochemical Surfactants FC–94," Apr., 1995, 4 pages.
Product Information: "3M Fluorad™ Fluorosurfactant FC–95," Feb., 1999, 4 pages.
Product Information: "3M Fluorad™ Fluorosurfactant FC–99," Feb., 1997, 2 pages.
Article: Edelstein et al., "Copper Interconnect Technology in Semiconductor Manufacturing," *Electrochemical Society Proceedings vol. 99–9*, (date unknown but prior to filing date of present application), pp. 1–9.
Article: Braun, "Aluminum Persists as Copper Age Dawns," *Semiconductor International*, vol. 22, No. 9, Aug., 1999, pp. 58–60, 63, 64, & 66.
Article: Singer, "Dual–Damascene Challenges Dielectric Etch," *Semiconductor International*, vol. 22, No. 9, Aug., 1999, pp. 68–70 & 72.
Article: Braun, "Copper Metrology Gains Complexity, Capabilities," *Semiconductor International*, vol. 24, No. 10, Sep., 2001, pp. 56–58, 60, 64, & 70.
Article: Martyak et al., "Copper Sulfonate Electrolytes for Metallization of Interconnect Technology," American Electroplaters and Surface Finishing Conference, Chicago, IL, Jun. 26, 2000, 15 pages.
PCT International Search Report, PCT/US03/33878; Mar. 3, 2004.

*Primary Examiner*—Robert R. Koehler

(57) ABSTRACT

The present invention provides methods of polishing and/or cleaning copper interconnects using sulfonic acid compositions.

27 Claims, No Drawings

METHODS FOR POLISHING AND/OR CLEANING COPPER INTERCONNECTS AND/OR FILM AND COMPOSITIONS THEREFOR

FIELD OF INVENTION

This invention relates to methods and compositions for the polishing and/or cleaning of copper interconnects and/or film. More particularly, this invention relates to methods for the polishing and/or cleaning of copper interconnects and/or film using compositions comprising at least one sulfonic acid, and to these compositions.

BACKGROUND OF THE INVENTION

Integrated circuits are found in a variety of electronic and computer products. Integrated circuits are interconnected networks of electrical components formed on a common foundation or substrate. Manufacturers typically use techniques such as layering, doping, masking, and etching to build thousands and even millions of microscopic resistors, transistors, and other electrical components on a silicon wafer. These components are then wired, or interconnected, together to form a specific electric circuit, for example, a computer memory.

Typically, the components are covered with an insulating layer of silicon dioxide. Then, small holes are etched in the insulating layer to expose portions of the components underneath. Trenches are then dug in the layer to define a wiring pattern. Thus, millions of microscopic components are interconnected. Then, through metallization, the holes and trenches are filled to form sub-micron diameter wires between the components.

The semiconductor industry uses a damascene or dual damascene process to form the interconnects. The damascene process involves forming relief patterns in a dielectric layer (etching), filling the resulting pattern with interconnect metal, then polishing away the excess metal on the wafer surface and leaving inlaid interconnect metal features.

In each manufacturing step, it is often necessary or desirable to modify or refine an exposed surface of the wafer to prepare the wafer for subsequent manufacturing steps. There are several known polishing processes: chemical mechanical polishing (CMP), electrochemical mechanical deposition (ECMD), and chemical enhanced polishing (CEP), are examples. In addition, wafer cleaning is typically used. Each of these processes uses an aqueous acidic or basic solution or slurry. These solutions or slurries have been comprised of basic solutions for polishing the silicon dioxide interdielectric, and acidic solutions for polishing the conductive copper interconnect. Non-uniform polishing leading to dishing (or films that are not flat) is one challenge encountered during planarization. Other challenges include avoiding scratches on the surface of the flat films, and removing particles, residues, and metal ions leftover from the planarization process.

Aluminum has traditionally been used as the conductive interconnect material. In making high performance microprocessor chips, however, copper is now often used as an interconnect material. Copper is often preferred because of its low electrical resistivity, and its low resistance-capacitance (RC) time delays in the metal interconnect that limit the performance of high-speed logic chips.

Thus, the need exists for methods of polishing and/or cleaning copper interconnects and/or film that use a solution or a slurry having an acidic nature that effectively dissolves and/or removes copper or copper oxide. Additionally, the need exists for methods of polishing and/or cleaning copper interconnects and/or film that have an etch rate that enables better control of deposition and/or cleaning, particularly on very thin seed layers.

SUMMARY OF THE INVENTION

The present invention provides methods of polishing and/or cleaning of copper interconnects and/or film using solutions and/or slurries (i.e., compositions) comprising sulfonic acid. Advantageously, the compositions of the present invention have an acidic nature that may effectively dissolve and/or remove copper or copper oxide. In an embodiment of the present invention, the compositions allow for an etch rate that may enable better control of deposition and/or cleaning of copper interconnects and/or film. The compositions of the present invention are comprised of at least one perfluorinated sulfonic acid ($HSO_3R_f$) and solvent.

In one aspect, the present invention is a method of polishing a copper interconnect and/or film comprising the steps of:

a) providing a composition comprising or consisting essentially of:

i) at least one weight percent of at least one perfluorinated sulfonic acid represented by the formula:

wherein $R_f$ is a perfluoroalkyl group having from 1 to about 12 carbon atoms that may be cyclic or acyclic, may optionally contain catenated ("in-chain") or terminal heteroatoms selected from the group consisting of N, O, and S (e.g., —$SF_4$— and —$SF_5$); and ii) solvent;

b) providing a substrate comprising at least one surface having at least one copper interconnect and/or film;

c) bringing the surface of the substrate and the composition into contact with each other to form an interface; and d) applying a force to promote copper dissolution at the interface.

Optionally, one or more additive(s) may be added to the composition.

Another embodiment of the present invention is a method of cleaning a copper interconnect and/or film comprising the steps of:

a) providing a composition comprising or consisting essentially of:

i) at least one weight percent of at least one perfluorinated sulfonic acid represented by the formula:

wherein $R_f$ is a perfluoroalkyl group having from 1 to about 12 carbon atoms that may be cyclic or acyclic, may optionally contain catenated or terminal heteroatoms selected from the group consisting of N, O, and S; and ii) solvent;

b) providing a substrate comprising at least one surface having at least one copper interconnect and/or film, the copper interconnect and/or film having at least one unwanted material on the surface;

c) bringing the surface of the substrate and the composition into contact with each other to form an interface; and d) allowing removal of unwanted surface material.

This method may further comprise the step of applying a force to promote copper dissolution at the interface.

Optionally, one or more additive(s) may be added to the composition.

In yet another embodiment, the present invention is a method of electrochemical mechanical deposition (ECMD) comprising the steps of:

a) providing a composition comprising or consisting essentially of:

i) at least one weight percent of at least one perfluorinated sulfonic acid represented by the formula:

$$H+$$
$$R_fSO_3^-$$

wherein $R_f$ is a perfluoroalkyl group having from 1 to about 12 carbon atoms that may be cyclic or acyclic, may optionally contain catenated or terminal heteroatoms selected from the group consisting of N, O, and S; and ii) solvent; and iii) copper salt;

b) providing a conductive substrate;

c) bringing the conductive substrate and the composition into contact with each other; and d) applying an electrochemical potential and a force to promote copper deposition and copper polishing.

Optionally, one or more additive(s) may be added to the composition.

In another aspect, the present invention is a composition comprising or consisting essentially of:

a) at least one weight percent of at least one perfluorinated sulfonic acid represented by the formula:

$$H+$$
$$R_fSO_3^-$$

wherein $R_f$ is a perfluoroalkyl group having from 1 to about 12 carbon atoms that may be cyclic or acyclic, may optionally contain catenated or terminal heteroatoms selected from the group consisting of N, O, and S;

b) solvent; and c) oxidizing agent.

DETAILED DESCRIPTION OF ILLUSTRATIVE EMBODIMENTS

The present invention relates to methods for cleaning and/or polishing copper interconnects and/or film using compositions having at least one sulfonic acid and solvent. Compositions of the present invention comprise both solutions and slurries. A solution is defined herein as a homogeneous mixture. A slurry is defined herein as a suspension of particles in a solution. A copper interconnect is defined herein as a surface pattern comprising copper. A film is defined herein as a thin coating of copper on a substrate such as a silicon wafer.

The solvent may be a polar organic solvent or water.

Optionally, other additives, including abrasives, other acids, oxidizing agents, corrosion inhibitors, chelating agents, electrolytes, brighteners, surfactants, leveling agents, etc. can also be added to the composition depending on the method.

The present invention also provides methods for polishing copper interconnects and/or film, methods for cleaning copper interconnects and/or film, and methods for ECMD.

In one embodiment, the compositions of the present invention comprise or consist essentially of at least one sulfonic acid, solvent, and oxidizing agent. The compositions of the present invention may also comprise or consist essentially of at least one sulfonic acid, solvent, and one or more additive(s).

Sulfonic Acids

The sulfonic acids of the present invention include perfluorinated sulfonic acids. These acids can be represented by the following formula:

$$H+$$
$$R_fSO_3^-$$

wherein $R_f$ is a perfluoroalkyl group having from 1 to about 12 carbon atoms, preferably from 1 to about 8 carbon atoms, and more preferably from 1 to about 4 carbon atoms. $R_f$ may be cyclic or acyclic. $R_f$ may optionally contain catenated or terminal heteroatoms such as N, O, and S (e.g., —$SF_4$— or —$SF_5$) within or at the end of the carbon chain.

The perfluorinated sulfonates may be prepared by standard methods known in the art. This methods include the anion precursor preparative methods described in the following references, the descriptions of which are incorporated by reference herein: sulfonate precursors—U.S. Pat. Nos. 5,176,943 (Wou), 4,582,781 (Chen et al.), 3,476,753 (Hanson), and 2,732,398 (Brice et al.),—sulfonate precursors having catenated oxygen or nitrogen in the fluorochemical group—U.S. Pat. No. 5,514,493 (Waddell et al.).

Examples of suitable anions of the present invention include, but are not limited to: $CF_3SO_3^-$, $C_4F_9SO_3^-$, $C_6F_{13}SO_3^-$, cyclo-$C_6F_{11}SO_3^-$, $CF_3OCF_2CF_2SO_3^-$, $(CF_3)_2NCF_2CF_2SO_3^-$, $SF_5CF_2CF_2SO_3^-$, and $C_2F_5SO_3^-$, $C_8F_{17}SO_3^-$.

Preferably, the anion is $CF_3SO_3^-$ or $C_4F_9SO_3^-$

The sulfonic acid is typically present in the composition in at least one weight percent. A particularly suitable composition may have at least about 25 weight percent sulfonic acid. In one embodiment, the sulfonic acid may be added to about 75 weight percent.

Solvent

The solvent of the present invention is water, a polar organic solvent, or mixtures thereof. A polar solvent is defined herein as having a dielectric constant greater than 5 at room temperature. Examples of suitable polar organic solvents include, but are not limited to, esters such as methyl formate, ethyl formate, methyl acetate, dimethyl carbonate, diethyl carbonate, propylene carbonate, ethylene carbonate, and butyrolactones (e.g., gamma butyrolactone); nitriles such as acetonitrile and benzonitrile; nitro compounds such as nitromethane or nitrobenzene; amides such as N,N-dimethylformamide, N,N-diethylformamide, and N-methylpyrrolidinone; sulfoxides such as dimethyl sulfoxide; sulfones such as dimethylsulfone, tetramethylene sulfone, and other sulfolanes; oxazolidinones such as N-methyl-2-oxazolidinone and mixtures thereof.

A particularly suitable solvent is water, and in particular de-ionized water. A preferred polar organic solvent is acetonitrile Optional Additives In some embodiments of the present invention, one or more optional additive(s) may be added to the composition. These additives include, but are not limited to, additives selected from the group consisting of oxidizing agents (e.g., $HNO_3$, $H_2O_2$, $Fe(NO_3)_3$, $O_3$), abrasive particles, other acids (e.g., $H_2SO_4$, dilute aqueous HF, HCl), corrosion inhibitors (e.g., benzotriazoles, tolyltriazole (TTA)), chelating agents (e.g., ammonium citrate, iminodiacetic acid (IDA), EDTA), electrolytes (e.g., ammonium hydrogen phosphate), surfactants, brighteners, levelers, etc. Typically these additives are present in a concentration ranging from 10 to 100,000 ppm.

For polishing applications, typically the compositions of the present invention either comprise abrasive particles or are used in combination with a fixed abrasive. Suitable abrasive particles include, but are not limited to, alumina, silica, and/or cerium oxide. Generally abrasive particles are present in a concentration ranging from about 3 to about 10 weight percent. Fixed abrasives typically are abrasive particles fixed in a polymer.

For ECMD applications, the compositions of the present invention further comprise a copper salt, which may be any copper salt that is soluble in the solvent (i.e., typically the concentration of the copper cation is at least 0.10 M in the solvent). Suitable copper salts include, but are not limited to, copper imides, copper methides, copper organo-sulfonates, copper sulfates, or mixtures thereof. Copper salts are typically present in a concentration ranging from about 0.10 M to about 1.5 M in the solvent.

Method for Preparing the Compositions

The compositions of the present invention may be prepared by at least partially dissolving or dispersing the sulfonic acid in solvent, preferably de-ionized water.

The sulfonic acid is generally employed at a concentration such that the rate of copper dissolution can be readily controlled.

Methods

The compositions of the present invention are particularly useful for polishing and/or cleaning copper interconnects and/or film. Examples of polishing include, but are not limited to, chemical mechanical polishing (CMP), chemical enhanced polishing (CEP), and electrochemical mechanical deposition (ECMD). Examples of cleaning include, but are not limited to, wafer cleaning.

The present invention provides a method for polishing copper interconnects and/or film comprising the steps of:

a) providing a composition comprising or consisting essentially of:

i) at least one weight percent of at least one perfluorinated sulfonic acid represented by the formula:

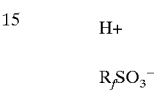

wherein $R_f$ is a perfluoroalkyl group having from 1 to about 12 carbon atoms that may be cyclic or acyclic, may optionally contain catenated or terminal heteroatoms selected from the group consisting of N, O, and S; and ii) solvent;

b) providing a substrate comprising at least one surface having at least one copper interconnect and/or film;

c) bringing the surface of the substrate and the composition into contact with each other to form an interface; and d) applying a force to promote copper dissolution at the interface.

Optionally, one or more additive(s) may be added to the composition.

The composition and the substrate may be brought into contact with each other using known methods. For example, the composition may be sprayed onto the copper-containing substrate, or alternatively the copper-containing substrate may be dipped into a "bath" of the composition.

The force applied in step d) may be either mechanical or electrochemical, or both.

Optionally, the copper dissolution (or corrosion) process may be reversed by applying an electrochemical potential to the copper coating or pattern sufficient to cause the copper ions in solution to replate. This process can be useful in controlling the rate and effectiveness of the copper polishing process.

Another embodiment of the present invention comprises a method of cleaning a copper interconnect and/or film comprising the steps of:

a) providing a composition comprising or consisting essentially of:

i) at least one weight percent of at least one perfluorinated sulfonic acid represented by the formula:

H+

$R_fSO_3^-$ wherein $R_f$ is a perfluoroalkyl group having from 1 to about 12 carbon atoms that may be cyclic or acyclic, may optionally contain catenated or terminal heteroatoms selected from the group consisting of N, O, and S; and ii) solvent;

b) providing a substrate comprising at least one surface having at least one copper interconnect and/or film, the copper interconnect and/or film having at least one unwanted material on the surface;

c) bringing the surface of the substrate and the composition into contact with each other to form an interface; and d) allowing removal of unwanted surface material at the interface.

This method may further comprise the step of applying a force to promote copper dissolution at the interface.

Optionally, one or more additive(s) may be added to the composition.

The unwanted materials include, but are not limited to, residues, films, and contaminants, including copper oxide.

In yet another embodiment, the present invention comprises a method of electrochemical mechanical deposition (ECMD) comprising the steps of:

a) providing a composition comprising or consisting essentially of:

i) at least one weight percent of at least one perfluorinated sulfonic acid represented by the formula:

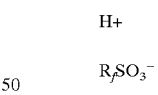

wherein $R_f$ is a perfluoroalkyl group having from 1 to about 12 carbon atoms that may be cyclic or acyclic, may optionally contain catenated or terminal heteroatoms selected from the group consisting of N, O, and S;

ii) solvent; and iii) copper salt;

b) providing a conductive substrate;

c) bringing the conductive substrate and the composition into contact with each other; and d) applying an electrochemical potential and a force to promote copper deposition and copper polishing.

In yet another embodiment, the present invention is a method of electrochemical mechanical deposition (ECMD) comprising the steps of:

a) providing a composition comprising or consisting essentially of:

i) at least one weight percent of at least one perfluorinated sulfonic acid represented by the formula:

H+

$R_fSO_3^-$ wherein $R_f$ is a perfluoroalkyl group having from 1 to about 12 carbon atoms that may be cyclic or acyclic, may optionally contain catenated or terminal heteroatoms selected from the group consisting of N, O, and S;
ii) solvent;
iii) copper salt; and
iv) one or more additive(s);
b) providing a conductive substrate;
c) bringing the conductive substrate and the composition into contact with each other; and
d) applying an electrochemical potential and a force to promote copper deposition and copper polishing.

The application of an electrochemical potential and a force in step d) of the ECMD methods may be simultaneous or alternating.

Suitable substrates of the present invention include, but are not limited to, a silicon or GaAs wafer coated with thin films of various compositions including metals, conductive polymers, and insulating materials.

The copper-containing substrate and the composition typically are brought into contact by immersion, spray, or spin dispense.

EXAMPLES

The present invention will be further described with reference to the following non-limiting examples and test methods. All parts, percentages, and ratios are by weight unless otherwise specified.

Test Methods

Test Method 1. Etch Rate of Copper Determined by Inductively Coupled Plasma/Atomic Emission Spectrometry (ICP/AES) Analysis.

In a 100 mL beaker was placed copper foil coupons (0.25 in$^2$, (1.6 cm$^2$)) and 50 mL of the acid composition to be tested. The copper coupon and composition was stirred for 1 hour, then the copper foil was removed and the concentration of Cu in the solution was determined by ICP/AES using a Perkin-Elmer Optima 3300 DV ICP (using standards of 0, 0.1, 1 ppm in 0.2% $H_2SO_4$). This is a measure of the amount of copper that is etched from the surface of the coupon and dissolved into solution.

Test Method 2. Etch Rate of Copper Determined by Electrochemical Impedance.

Electrochemical impedance analysis was used as an alternative method to measure the etch rate of copper in the various acid solutions (1.75 M). A cell equipped with a 3 mm flat disc copper working electrode, a platinum mesh counter electrode, and a Ag/AgCl reference electrode was used for all measurements. The Cu electrode was polished using an alumina slurry and thoroughly rinsed with de-ionized water before each analysis. All measurements were taken at the open circuit potential. Use of an equivalent circuit model and least-squares fitting allowed for the determination of the resistance to charge transfer (Rct) for each acid solution.

Example 1 and Comparative Example C1

Etch Rate of Copper Using Test Method 1

The copper etch rate (ppm/in$^2$) was determined using Test Method 1 for the acid solutions listed in Table 1.

TABLE 1

| Ex | Acid Solution | Copper Concentration ppm/in$^2$ (ppm/cm$^2$) |
|---|---|---|
| 1 | CF$_3$SO$_3$H (1.75 M) | 2427.5 (376.3) |
| C1 | H$_2$SO$_4$ (1.75 M) | 2859.1 (443.2) |

The data in Table 1 indicate that CF$_3$SO$_3$H etched copper at a slower rate than the Comparative Example C1 using H$_2$SO$_4$.

Example 2 and Comparative Example 2

Etch Rate of Copper using Test Method 2

The copper etch rate was determined using Test Method 2. The resulting resistance to charge transfer (Rct) values are listed in Table 2.

TABLE 2

| Ex | Acid Solution | Rct (kOhm) |
|---|---|---|
| 2 | CF$_3$SO$_3$H (1.75 M) | 32.5 |
| C2 | H$_2$SO$_4$ (1.75 M) | 15.4 |

The data in Table 2 show that CF$_3$SO$_3$H solutions had higher resistance to charge transfer values, indicating the solutions etched copper at a slower rate than the Comparative Example C2 using H$_2$SO$_4$.

Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims as set forth herein as follows.

What is claimed is:

1. A method of polishing a copper interconnect and/or film comprising the steps of:
a) providing a composition comprising:
i) at least one weight percent of at least one perfluorinated sulfonic acid represented by the formula:

H+

$R_fSO_3^-$ wherein $R_f$ is a perfluoroalkyl group having from 1 to about 12 carbon atoms that may be cyclic or acyclic, may optionally contain catenated or terminal heteroatoms selected from the group consisting of N, O, and S; and
ii) solvent;
b) providing a substrate comprising at least one surface having at least one copper interconnect and/or film;
c) bringing the surface of the substrate and the composition into contact with each other to form an interface; and
d) applying a force to promote copper dissolution at the interface.

2. The method according to claim 1, wherein said composition further comprises
iii) one or more additive(s).

3. The method according to claim 2, wherein the one or more additive(s) is selected from the group consisting of 4. The method according to claim 1, wherein said solvent is water.

5. The method according to claim 1, wherein $R_f$ comprises from 1 to 8 carbon atoms.

6. The method according to claim 1, wherein $R_f$ comprise from 1 to 4 carbon atoms.

7. The method according to claim 1, wherein said sulfonate anion is selected from the group consisting of: $CF_3SO_3^-$, $C_4F_9SO_3^-$, $C_6F_{13}SO_3^-$, cyclo-$C_6F_{11}SO_3^-$, $CF_3OCF_2CF_2SO_3^-$, $(CF_3)_2NCF_2CF_2SO_3^-$, $SF_5CF_2CF_2SO_3^-$, $C_2F_5SO_3H$, and $C_8F_{17}SO_3H$.

8. The method according to claim 1, wherein the sulfonic acid is present at a concentration of at least about 25 weight percent of the composition.

9. The method according to claim 1, wherein the sulfonic acid is present at a concentration of up to about 75 weight percent of the composition.

10. A method of cleaning a copper interconnect and/or film comprising the steps of:
   a) providing a composition comprising:
      i) at least one weight percent of at least one perfluorinated sulfonic acid represented by the formula:

H+

$R_fSO_3^-$ wherein $R_f$ is a perfluoroalkyl group having from 1 to about 12 carbon atoms that may be cyclic or acyclic, may optionally contain catenated or terminal heteroatoms selected from the group consisting of N, O, and S; and
      ii) solvent;
   b) providing a substrate comprising at least one surface having at least one copper interconnect and/or film, the copper interconnect and/or film having at least one unwanted material on the surface;
   c) bringing the surface of the substrate and the composition into contact with each other to form an interface; and
   d) allowing removal of unwanted surface material at the interface.

11. The method according to claim 10, wherein said composition further comprises
   iii) one or more additive(s).

12. The method according to claim 11, wherein the one or more additive(s) is selected from the group consisting of abrasive particles, other acids, oxidizing agents, etchants, corrosion inhibitors, chelating agents, electrolytes, surfactants, brighteners, and levelers.

13. The method according to claim 10, wherein said solvent is water.

14. The method according to claim 10, wherein $R_f$ comprises from 1 to 8 carbon atoms.

15. The method according to claim 10, wherein $R_f$ comprises from 1 to 4 carbon atoms.

16. The method according to claim 10, wherein said sulfonate anion is selected from the group consisting of: $CF_3SO_3^-$, $C_4F_9SO_3^-$, $C_6F_{13}SO_3^-$, cyclo-$C_6F_{11}SO_3^-$, $CF_3OCF_2CF_2SO_3^-$, $(CF_3)_2NCF_2CF_2SO_3^-$, $SF_5CF_2CF_2SO_3^-$, $C_2F_5SO_3H$, and $C_8F_{17}SO_3H$.

17. The method according to claim 10, wherein the sulfonic acid is present at a concentration of at least about 25 weight percent of the composition.

18. The method according to claim 10, further comprising the step of
   d) applying a force to promote copper dissolution at the interface.

19. The method according to claim 18, wherein said force is mechanical, electrochemical, or a mixture thereof.

20. A method of electrochemical mechanical deposition comprising the steps of:
   a) providing a composition comprising:
      i) at least one weight percent of at least one perfluorinated sulfonic acid represented by the formula:

H+

$R_fSO_3^-$ wherein $R_f$ is a perfluoroalkyl group having from 1 to about 12 carbon atoms that may be cyclic or acyclic, may optionally contain catenated or terminal heteroatoms selected from the group consisting of N, O, and S;
      ii) solvent; and
      iii) copper salt;
   b) providing a conductive substrate;
   c) bringing the conductive substrate and the composition into contact with each other; and
   d) applying an electrochemical potential and a force to promote copper deposition and copper polishing.

21. The method according to claim 20, wherein said composition further comprises
   iv) one or more additive(s).

22. The method according to claim 21, wherein the one or more additive is selected from the group consisting of abrasive particles, other acids, oxidizing agents, etchants, corrosion inhibitors, chelating agents, electrolytes, surfactants, brighteners, and levelers.

23. The method according to claim 22, wherein $R_f$ comprises from 1 to 8 carbon atoms.

24. The method according to claim 20, wherein said sulfonic is selected from the group consisting of: $CF_3SO_3^-$, $C_4F_9SO_3^-$, $C_6F_{13}SO_3^-$, cyclo-$C_6F_{11}SO_3^-$, $CF_3OCF_2CF_2SO_3^-$, $(CF_3)_2NCF_2CF_2SO_3^-$, $SF_5CF_2CF_2SO_3^-$, $C_2F_5SO_3H$, and $C_8F_{17}SO_3H$.

25. The method according to claim 20, wherein the sulfonate anion is present at a concentration of at least about 25 weight percent of the composition.

26. A composition comprising:
   a) at least one weight percent of at least one perfluorinated sulfonic acid represented by the formula:

H+

$R_fSO_3^-$ wherein $R_f$ is a perfluoroalkyl group having from 1 to about 12 carbon atoms that may be cyclic or acyclic, may optionally contain catenated or terminal heteroatoms selected from the group consisting of N, O, and S;
   b) solvent; and
   c) oxidizing agent.

27. The composition according to claim 26, wherein said oxidizing agent is selected from the group consisting of nitric acid, $HNO_3$, $H_2O_2$, $Fe(NO_3)_3$, $O_3$, and mixtures thereof.

* * * * *

UNITED STATES PATENT AND TRADEMARK OFFICE
CERTIFICATE OF CORRECTION

PATENT NO. : 6,858,124 B2
DATED : February 22, 2005
INVENTOR(S) : Zazzera, Lawrence A.

It is certified that error appears in the above-identified patent and that said Letters Patent is hereby corrected as shown below:

Column 10,
Lines 2-3, delete "the step of d) applying" and insert -- the step of: applying --.

Signed and Sealed this

Fourth Day of October, 2005

JON W. DUDAS
*Director of the United States Patent and Trademark Office*